United States Patent
Fu

(10) Patent No.: US 8,400,616 B2
(45) Date of Patent: Mar. 19, 2013

(54) LASER INTERFERENCE LITHOGRAPHY APPARATUS CAPABLE OF STITCHING SMALL EXPOSED AREAS INTO LARGE EXPOSED AREA

(75) Inventor: Chien-Chung Fu, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 468 days.

(21) Appl. No.: 12/839,716

(22) Filed: Jul. 20, 2010

(65) Prior Publication Data
US 2011/0019175 A1 Jan. 27, 2011

(30) Foreign Application Priority Data
Jul. 22, 2009 (TW) .............................. 98124659 A

(51) Int. Cl.
G03B 27/54 (2006.01)
G02B 27/00 (2006.01)
G03B 27/58 (2006.01)

(52) U.S. Cl. ............ 355/67; 355/72; 359/577; 359/584; 359/578

(58) Field of Classification Search .................. None
See application file for complete search history.

(56) References Cited

U.S. PATENT DOCUMENTS

| | | | |
|---|---|---|---|
| 6,709,790 B1 * | 3/2004 | Gratrix | 430/1 |
| 6,882,477 B1 * | 4/2005 | Schattenburg et al. | 359/577 |
| 7,304,775 B2 * | 12/2007 | Hobbs et al. | 359/11 |
| 7,642,041 B2 * | 1/2010 | Wago | 430/321 |

* cited by examiner

Primary Examiner — Toan Ton
Assistant Examiner — Michelle Iacoletti
(74) Attorney, Agent, or Firm — Muncy, Geissler Olds & Lowe, PLLC

(57) ABSTRACT

A laser interference lithography apparatus capable of stitching small exposed areas into a large exposed area includes a body, a laser beam supplying unit, a reflecting mechanism, an L-shaped fixing mechanism and a substrate stage. The laser beam supplying unit fixed onto the body provides a laser beam. The reflecting mechanism is movably and rotatably mounted on the body. The L-shaped fixing mechanism mounted on the body includes a first mounting seat and a second mounting seat. An upright first reflecting mirror is fixed to the first mounting seat. The second mounting seat connected to the first mounting seat fixes a horizontal mask, and is substantially perpendicular to the first mounting seat. The substrate stage, movably mounted on the body and disposed below the second mounting seat, supports a substrate. Thus, a large-area pattern formed by stitching small-area patterns may be obtained.

7 Claims, 4 Drawing Sheets

LASER INTERFERENCE LITHOGRAPHY APPARATUS CAPABLE OF STITCHING SMALL EXPOSED AREAS INTO LARGE EXPOSED AREA

This application claims priority of No. 098124659 filed in Taiwan R.O.C. on Jul. 22, 2009 under 35 USC 119, the entire content of which is hereby incorporated by reference.

BACKGROUND OF THE INVENTION

1. Field of the Invention

The invention relates in general to a laser interference lithography apparatus, and more particularly to a laser interference lithography apparatus capable of stitching small exposed areas into a large exposed area.

2. Related Art

Recently, liquid crystal displays are gradually developed to have the increasing sizes. Thus, the polarizer used in the liquid crystal display is also gradually developed to have the increasing size. A large-scale imprinting mold has to be adopted to manufacture the large-scale polarizer. The large-scale imprinting mold may be manufactured by way of laser interference. However, a high-power laser source and a large-scale collimator have to be employed in the prior art in order to manufacture the large-scale imprinting mold, wherein the angle of the laser beam cannot be easily adjusted, and the manufacturing cost is relatively high.

In addition, the wafer or substrate is fixed vertically in the conventional laser interference lithography apparatus. Thus, the moving platform for supporting the wafer or substrate tends to be influenced by the gravity force, thereby causing the exposure system to become unstable.

SUMMARY OF THE INVENTION

It is therefore an object of the invention to provide a laser interference lithography apparatus capable of stitching small exposed areas into a large exposed area so that the apparatus cost can be lowered, and the influence of the gravity force on the moving platform can be reduced, and the stabler large-area interference pattern having the higher quality may be obtained.

To achieve the above-identified object, the invention provides a laser interference lithography apparatus including a body, a laser beam supplying unit, a reflecting mechanism, an L-shaped fixing mechanism and a substrate stage. The laser beam supplying unit fixed onto the body provides a laser beam. The reflecting mechanism is movably and rotatably mounted on the body. The L-shaped fixing mechanism mounted on the body includes a first mounting seat and a second mounting seat. An upright first reflecting mirror is fixed to the first mounting seat. The second mounting seat is connected to the first mounting seat, to be fixed to a horizontal mask, and substantially perpendicular to the first mounting seat. The substrate stage, movably mounted on the body and disposed below the second mounting seat, supports a substrate. A first portion of the laser beam is reflected, by the reflecting mechanism and the first reflecting mirror, to the mask. A second portion of the laser beam is reflected, by the reflecting mechanism, to the mask so that the first portion and the second portion of the laser beam generate an interference pattern on a pattern layer of the substrate.

According to the laser interference lithography apparatus of the invention, the large-area interference patterns may be manufactured with the low-power laser. These interference patterns may have periodicity. After these interference patterns have been manufactured, it is possible to manufacture the large-area imprinting mold or any other mold by way of exposure, development, hard mask etching and pattern transferring.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention.

DETAILED DESCRIPTION OF THE INVENTION

The present invention will be apparent from the following detailed description, which proceeds with reference to the accompanying drawings, wherein the same references relate to the same elements.

Figure 1:
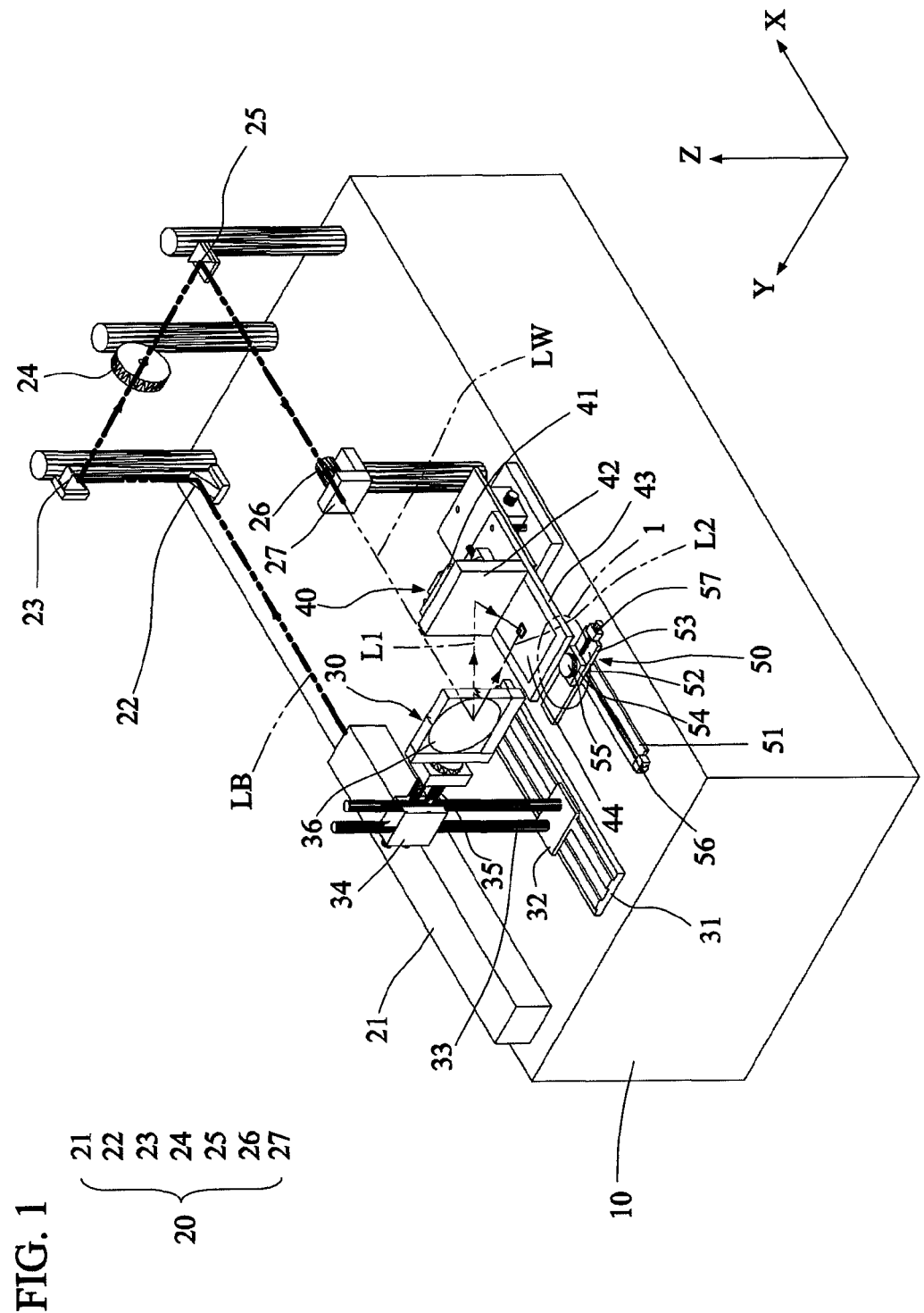
FIG. 1 is a pictorial view showing a laser interference lithography apparatus according to a preferred embodiment of the invention.
Figure 2:
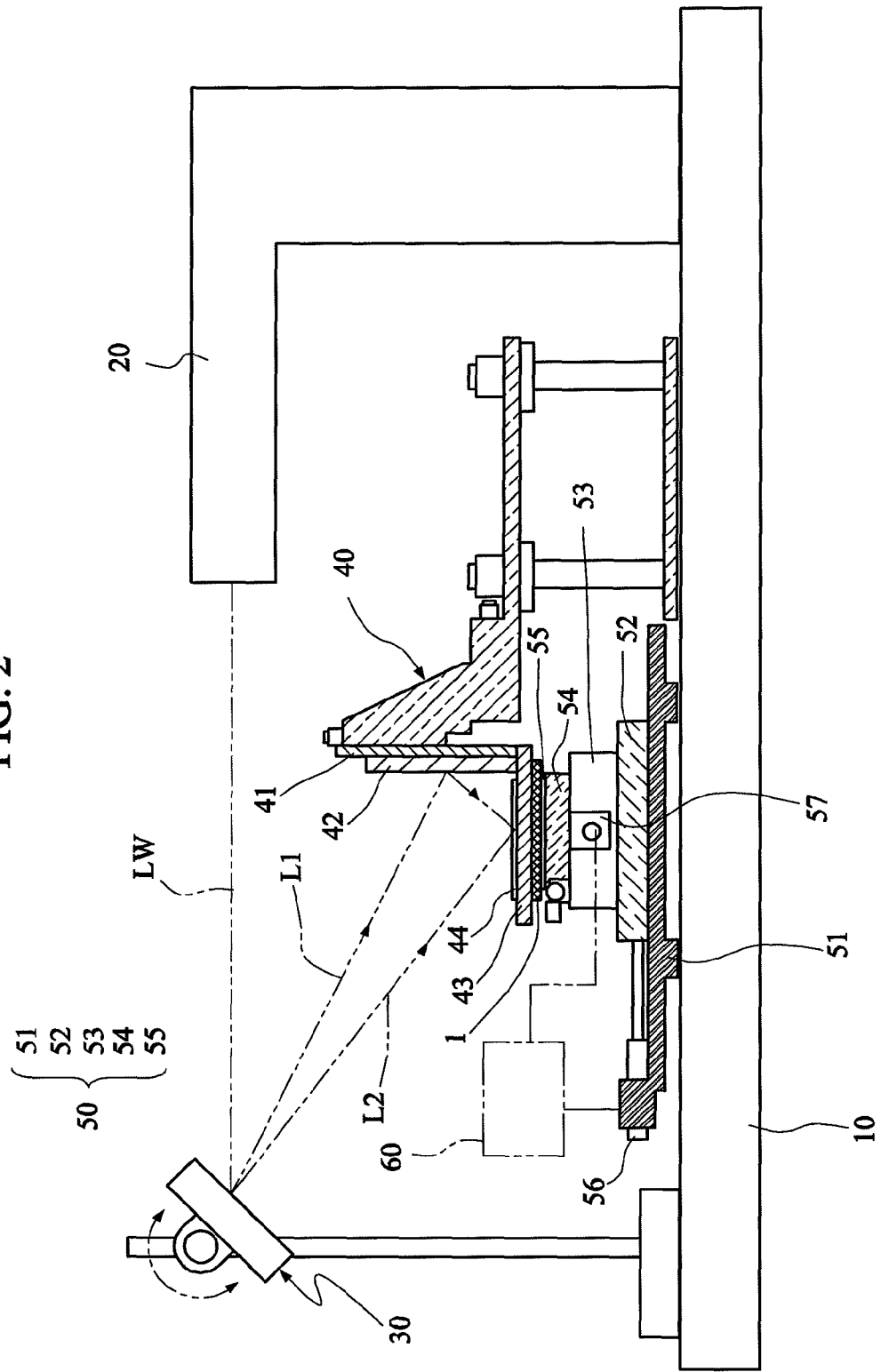
FIG. 2 is a schematic front view showing the apparatus of FIG. 1.
Figure 3:
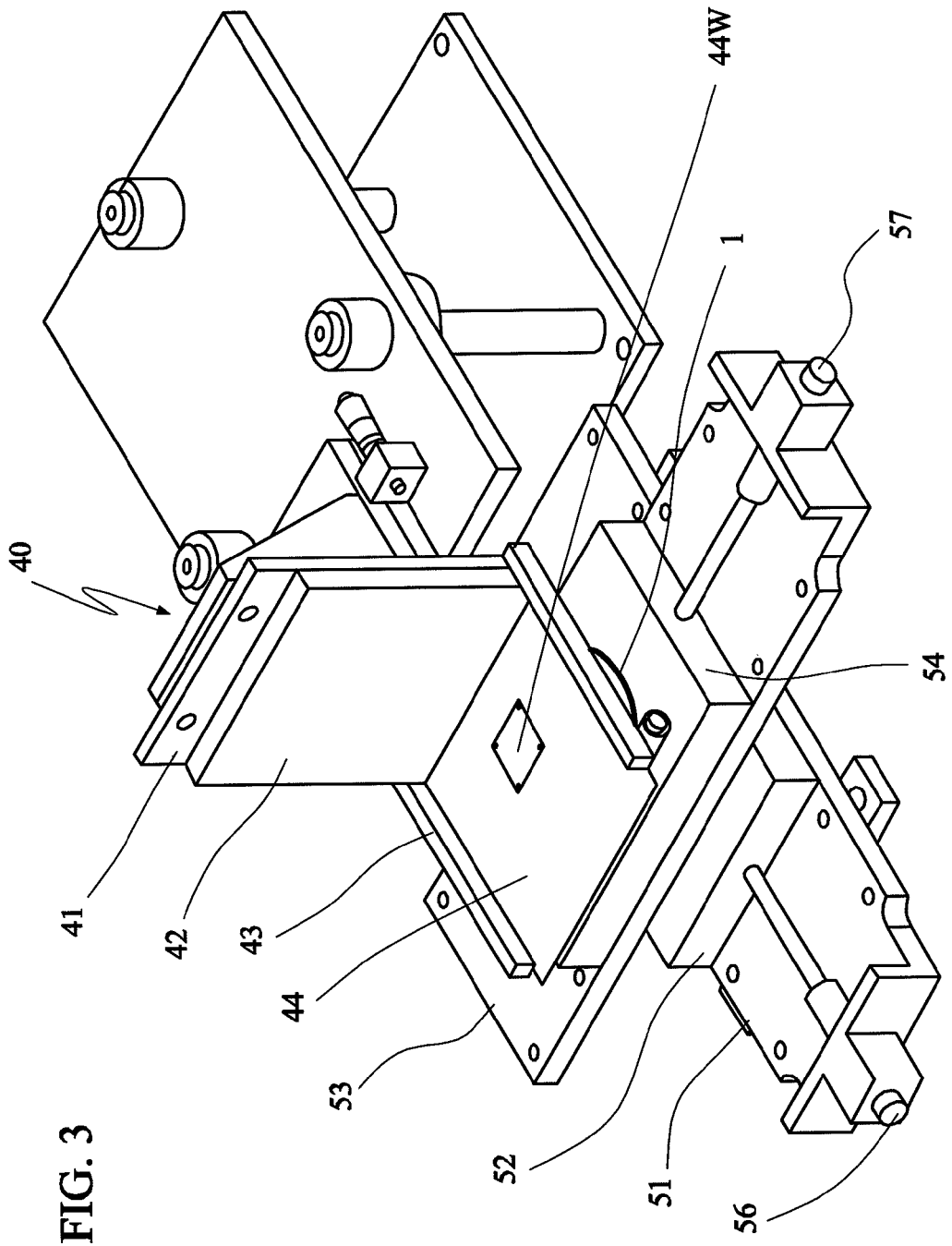
FIG. 3 is a partially pictorial view showing the apparatus of FIG. 1.

FIG. 1 is a pictorial view showing a laser interference lithography apparatus according to a preferred embodiment of the invention. FIG. 2 is a schematic front view showing the apparatus of FIG. 1. FIG. 3 is a partially pictorial view showing the apparatus of FIG. 1. Referring to FIGS. 1 to 3, the laser interference lithography apparatus, which is particularly adapted for the large-area exposure, includes a body 10, a laser beam supplying unit 20, a reflecting mechanism 30, an L-shaped fixing mechanism 40 and a substrate stage 50.

The laser beam supplying unit 20 fixed onto the body 10 provides a laser beam LW. The laser beam supplying unit 20 includes a laser source 21, a first mirror 22, a second mirror 23, a shutter 24, a third mirror 25, a pin hole 26 and a lens 27. The laser source 21 provides a laser beam LB, which travels sequentially through the first mirror 22, the second mirror 23, the shutter 24, the third mirror 25, the pin hole 26 and the lens 27 so that the laser beam LW is then generated. The pin hole 26 and the lens 27 may be combined together through a housing. The laser source 21 may be a helium-cadmium (He—Cd) laser source or any other laser source. A level of the first mirror 22 is lower than a level of each of the second mirror 23 and the third mirror 25. This, the heavier laser source 21 may be mounted on the body 10 to increase the stability.

The reflecting mechanism 30 is movably and rotatably mounted on the body 10. The reflecting mechanism 30 includes a first sliding track 31, a first slider 32, a second sliding track 33, a second slider 34, a third sliding track 35 and a second reflecting mirror 36. The first sliding track 31 is fixed onto the body 10. The first slider 32 may be moved on the first sliding track 31 in an X-axis direction. The second sliding track 33 is fixed onto the first slider 32. The second slider 34 may be moved on the second sliding track 33 in a Z-axis direction. The third sliding track 35 may be moved on the second slider 34 in a Y-axis direction. The second reflecting mirror 36 is pivotally connected to the third sliding track 35. Therefore, the second reflecting mirror 36 may be adjusted to the desired angle and the desired position.

The L-shaped fixing mechanism 40 is mounted on the body 10 and includes a first mounting seat 41 and a second mounting seat 43. An upright first reflecting mirror 42 is fixed to the first mounting seat 41. The second mounting seat 43 connected to the first mounting seat 41 is to be fixed to a horizontal mask 44 and is substantially perpendicular to the first mounting seat 41.

The substrate stage 50, which is movably mounted on the body 10 and disposed below the second mounting seat 43, supports a substrate 1. The substrate 1 may be a silicon wafer or a glass substrate or may be made of other suitable materials. The substrate stage 50 includes a first platform 51, a second platform 52, a third platform 53, a fourth platform 54 and a substrate chuck 55. The first platform 51 is fixed onto the body 10. The second platform 52 may be slideably mounted on the first platform 51 in the X-axis direction. The third platform 53 is fixed onto the second platform 52. The fourth platform 54 may be slideably mounted on the third platform 53 in the Y-axis direction. The substrate chuck 55 fixed onto the fourth platform 54 chucks the substrate 1.

Figure 4:
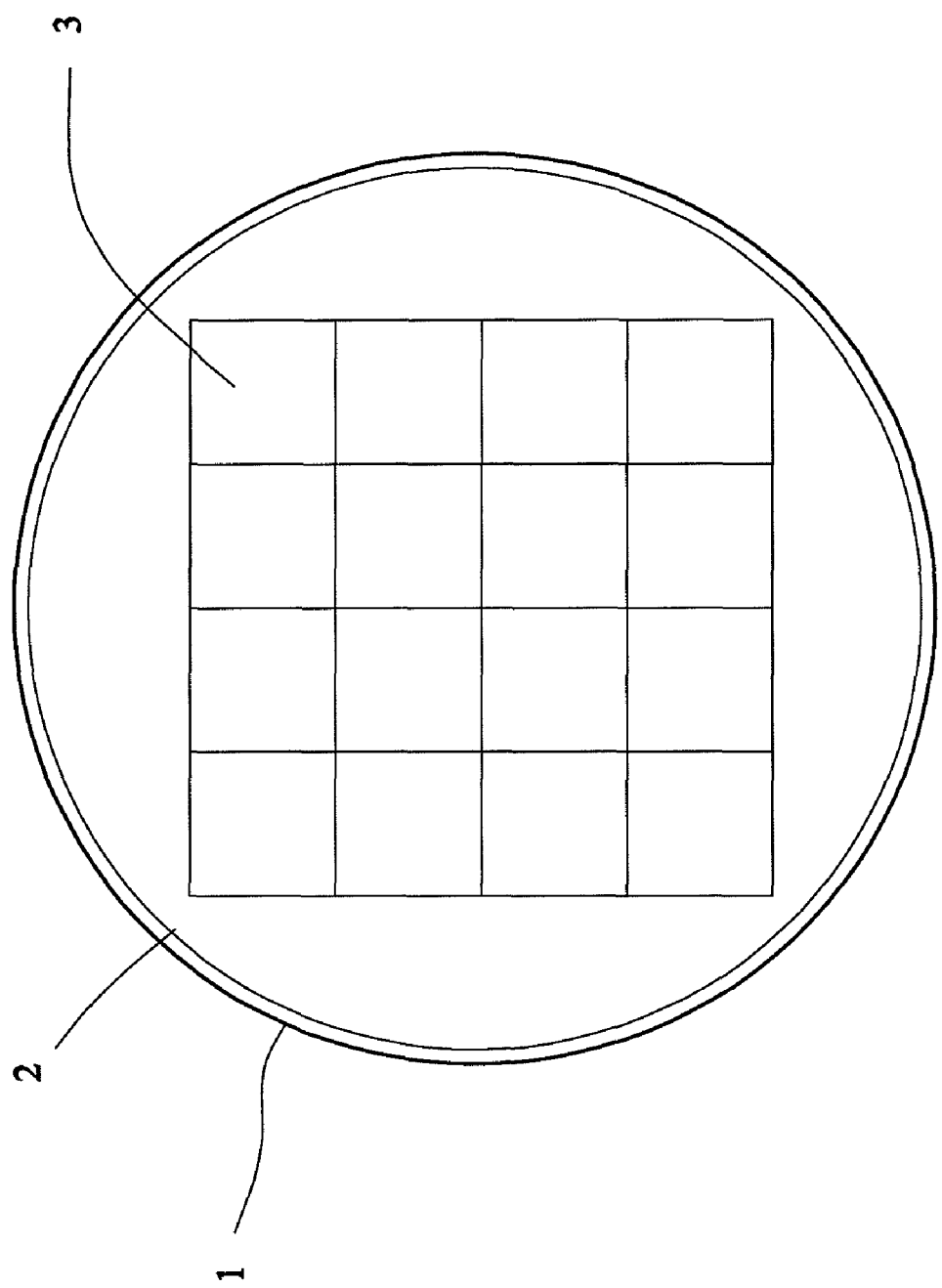
FIG. 4 shows an interference pattern formed by stitching small-area patterns together using the laser interference lithography apparatus of the invention.

A first portion L1 of the laser beam LW is reflected, by the reflecting mechanism 30 and the first reflecting mirror 42, to the mask 44, while a second portion L2 of the laser beam LW is reflected, by the reflecting mechanism 30, to the mask 44 so that an interference pattern 3 (see FIG. 4) is generated on a pattern layer 2 of the substrate 1 according to the first portion L1 and the second portion L2 of the laser beam LW. The pattern layer 2 may be made of a photoresist material or any other material. Because the substrate 1 is in a horizontal state, the pattern layer 2 on the substrate 1 cannot be influenced by the gravity force of the moving platform to cause the system to become unstable.

In addition, the substrate stage 50 may further include an X-axis driving mechanism 56 and a Y-axis driving mechanism 57. The X-axis driving mechanism 56, fixed onto the first platform 51 and connected to the second platform 52, drives the second platform 52 to slide in the X-axis direction. The Y-axis driving mechanism 57, fixed onto the third platform 53 and connected to the fourth platform 54, drives the fourth platform 54 to slide in the Y-axis direction. The driving mechanism may be constituted by a motor, a lead screw and a nut, or by a motor, a worm wheel and a worm shaft.

In this case, as shown in FIG. 2, the laser interference lithography apparatus may further include a control unit 60, connected to the X-axis driving mechanism 56 and the Y-axis driving mechanism 57, which drive the third platform 53 to slide in the X-axis direction and the Y-axis direction according to the dimensions of a window 44W of the mask 44 (e.g., the X-axis dimension and the Y-axis dimension). Thus, the overall pattern shown in FIG. 4 may be obtained by stitching the interference patterns 3 together.

According to the laser interference lithography apparatus of the invention, the large-area interference patterns may be manufactured with the low-power laser. These interference patterns may have periodicity. After these interference patterns have been manufactured, it is possible to manufacture the large-area imprinting mold or any other mold by way of exposure, development, hard mask etching and pattern transferring.

While the invention has been described by way of examples and in terms of preferred embodiments, it is to be understood that the invention is not limited thereto. To the contrary, it is intended to cover various modifications. Therefore, the scope of the appended claims should be accorded the broadest interpretation so as to encompass all such modifications.

What is claimed is:

1. A laser interference lithography apparatus, comprising:
    a body;
    a laser beam supplying unit, fixed onto the body, for providing a laser beam;
    a reflecting mechanism movably and rotatably mounted on the body;
    an L-shaped fixing mechanism, mounted on the body and comprising:
        a first mounting seat, to which an upright first reflecting mirror is fixed; and
        a second mounting seat, which is connected to the first mounting seat, to be fixed to a horizontal mask, and substantially perpendicular to the first mounting seat; and
    a substrate stage, movably mounted on the body and disposed below the second mounting seat, for supporting a substrate, wherein a first portion of the laser beam is reflected, by the reflecting mechanism and the first reflecting mirror, to the mask, and a second portion of the laser beam is reflected, by the reflecting mechanism, to the mask so that the first portion and the second portion of the laser beam generate an interference pattern on a pattern layer of the substrate.

2. The apparatus according to claim 1, wherein the laser beam supplying unit comprises:
    a laser source, a first mirror, a second mirror, a shutter, a third mirror, a pin hole and a lens, wherein the laser source provides a laser beam, the laser beam sequentially travels through the first mirror, the second mirror, the shutter, the third mirror, the pin hole and the lens.

3. The apparatus according to claim 2, wherein a level of the first mirror is lower than a level of each of the second mirror and the third mirror.

4. The apparatus according to claim 1, wherein the reflecting mechanism comprises:
    a first sliding track fixed onto the body;
    a first slider, which may be moved on the first sliding track in an X-axis direction;
    a second sliding track fixed onto the first slider;
    a second slider, which may be moved on the second sliding track in a Z-axis direction;
    a third sliding track, which may be moved on the second slider in a Y-axis direction; and
    a second reflecting mirror pivotally connected to the third sliding track.

5. The apparatus according to claim 1, wherein the substrate stage comprises:
    a first platform, fixed onto the body;
    a second platform, which is slideably mounted on the first platform and may slide in an X-axis direction;
    a third platform fixed onto the second platform;
    a fourth platform, which is slideably mounted on the third platform and may slide in a Y-axis direction; and
    a substrate chuck, fixed onto the fourth platform, for chucking the substrate.

6. The apparatus according to claim 5, wherein the substrate stage further comprises:
- an X-axis driving mechanism, fixed onto the first platform and connected to the second platform, for driving the second platform to slide in the X-axis direction; and
- a Y-axis driving mechanism, fixed onto the third platform and connected to the fourth platform, for driving the fourth platform to slide in the Y-axis direction.

7. The apparatus according to claim 6, further comprising:
a control unit, connected to the X-axis driving mechanism and the Y-axis driving mechanism, for controlling the third platform to slide in the X-axis direction and the Y-axis direction according to dimensions of a window of the mask.

* * * * *